United States Patent
Heisswolf et al.

(10) Patent No.: US 9,369,150 B2
(45) Date of Patent: Jun. 14, 2016

(54) DATA STORAGE DEVICE AND METHOD FOR PROTECTING A DATA ITEM AGAINST UNAUTHORIZED ACCESS

(71) Applicants: Dirk Heisswolf, Munich (DE); Andreas Ralph Pachl, Neubiberg (DE); Alexander Stephan Schilling, Berg (DE)

(72) Inventors: Dirk Heisswolf, Munich (DE); Andreas Ralph Pachl, Neubiberg (DE); Alexander Stephan Schilling, Berg (DE)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 142 days.

(21) Appl. No.: 14/445,939

(22) Filed: Jul. 29, 2014

(65) Prior Publication Data

US 2016/0036463 A1    Feb. 4, 2016

(51) Int. Cl.
*G11C 29/00* (2006.01)
*H03M 13/09* (2006.01)
*G06F 11/10* (2006.01)

(52) U.S. Cl.
CPC .......... *H03M 13/09* (2013.01); *G06F 11/1004* (2013.01); *G06F 11/1076* (2013.01)

(58) Field of Classification Search
CPC . G06F 11/1004; G06F 11/1076; H03M 13/09
USPC ........................................................ 714/763
See application file for complete search history.

(56) References Cited

U.S. PATENT DOCUMENTS

| | | | |
|---|---|---|---|
| 5,003,539 A | 3/1991 | Takemoto et al. | |
| 8,694,862 B2 | 4/2014 | Sazeides et al. | |
| 2001/0025311 A1* | 9/2001 | Arai | G06F 21/6218 709/225 |
| 2007/0124557 A1* | 5/2007 | Kanai | G06F 11/1044 711/164 |
| 2009/0138963 A1* | 5/2009 | Sato | G06F 12/1441 726/17 |

FOREIGN PATENT DOCUMENTS

| WO | 2014203030 A1 | 12/2014 |
|---|---|---|
| WO | 2014203031 A1 | 12/2014 |

OTHER PUBLICATIONS

Gumpertz, Richard; "Combining tags with error codes", Proceedings of Tenth Annual International Symposium on Computer Architecture; Stockholm, Sweden; Jun. 1983; pp. 160-165.

* cited by examiner

*Primary Examiner* — David Ton

(57) ABSTRACT

A method for protecting a data item against unauthorized access and a data processing device is disclosed comprising a memory unit and a memory control unit to protect data items stored in the memory unit against prohibited access. Upon a write access the memory control unit forms a first data word comprising a data item and a first key; computes a first error-detection code; and stores the data item along with the first error-detection code. Upon a read access the memory control unit reads the data item and the first error-detection code; forms a second data word comprising the data item and a second key; computes a second error-detection code to the second data word; and determines a syndrome on the basis of the first error-detection code and the second error-detection code, wherein the syndrome is indicative of whether or not the first and second data words are identical.

20 Claims, 6 Drawing Sheets

|  | Data bit syndromes | | | | | | | | | | | | | | | | Parity bit syndromes | | | | | | Unused syndromes | | | |
|---|---|---|---|---|---|---|---|---|---|---|---|---|---|---|---|---|---|---|---|---|---|---|---|---|---|---|
| | F | E | D | C | B | A | 9 | 8 | 7 | 6 | 5 | 4 | 3 | 2 | 1 | 0 | 5 | 4 | 3 | 2 | 1 | 0 | | | | |
| Syndrome | 0 | 0 | 1 | 0 | 1 | 1 | 0 | 0 | 1 | 0 | 1 | 1 | 0 | 0 | 1 | 1 | 1 | 0 | 0 | 0 | 0 | 0 | 1 | 1 | 0 | 0 |
| | 0 | 1 | 0 | 1 | 0 | 1 | 1 | 1 | 0 | 1 | 0 | 1 | 1 | 0 | 1 | 1 | 0 | 1 | 0 | 0 | 0 | 0 | 0 | 0 | 1 | 0 |
| | 1 | 0 | 1 | 0 | 1 | 0 | 0 | 0 | 0 | 0 | 1 | 0 | 1 | 1 | 1 | 0 | 0 | 0 | 1 | 0 | 0 | 0 | 0 | 0 | 0 | 1 |
| | 1 | 1 | 0 | 1 | 0 | 0 | 1 | 1 | 1 | 1 | 1 | 0 | 0 | 1 | 0 | 1 | 0 | 0 | 0 | 1 | 0 | 0 | 0 | 1 | 0 | 0 |
| | 0 | 0 | 0 | 0 | 0 | 1 | 0 | 1 | 1 | 0 | 0 | 1 | 0 | 1 | 1 | 0 | 0 | 0 | 0 | 0 | 1 | 0 | 1 | 0 | 1 | 1 |
| | 1 | 1 | 1 | 1 | 1 | 0 | 0 | 0 | 0 | 1 | 1 | 0 | 1 | 0 | 0 | 0 | 0 | 0 | 0 | 0 | 0 | 1 | 1 | 1 | 1 | 1 |

Fig. 2

| CPU access | | Memory faults | | |
|---|---|---|---|---|
| Expected region | Stored region | No data corruption | Single bit data corruption | Double bit data corruption |
| A | A | 0 | 1 (data syndrome) | 2 |
| A | B | 2 | 3 | 4 |
| A | none | 1 (region syndrome) | 2 | 3 |
| none (also privileged access) | none | 0 | 1 (data syndrome) | 2 |

| | |
|---|---|
| 0 | Valid data and no access violation |
| 1 (data syndrome) | Correctable data corruption and no access violation |
| 1 (region syndrome) | Valid data and detected access violation |
| 2 | Uncorrectable error detected |
| 3 | Reliable error detection only without error correction |
| 4 | No reliable error detection |

Fig. 6

DATA STORAGE DEVICE AND METHOD FOR PROTECTING A DATA ITEM AGAINST UNAUTHORIZED ACCESS

FIELD OF THE INVENTION

This invention relates to a data storage device and to a method for protecting a data item against unauthorized access.

BACKGROUND OF THE INVENTION

A data storage device or memory device is a device capable of storing digital data items. A data item may comprise one or several bits. A data storage device may comprise one or more memory locations at which data can be stored. Each memory location may have an address for identifying the memory location. Depending on the type of data storage device, a memory location may be known as a register. Generally speaking, a memory location may, however, comprise one or more than one register. It may desirable or imperative to protect a stored data item against data corruption and against unauthorized access.

Data corruption comprises a variety of effects that may provoke unintended changes to a stored data item. An example of data corruption is a bit flip, that is a state change of a bit of the data item, due to, e.g., neutron impact or electrostatic discharge. Access to a stored data item may comprise reading the data item from the memory location at which it is stored as well as overwriting the data item at the memory location. One way of tackling the problem of data corruption involves the use of error detecting codes (EDC), in particular error correcting codes (ECC). An error correcting code is an error detecting code that allows not only detecting a bit change in a data item but correcting it as well. Memories with error correcting codes (ECC memories) are widely used in various kinds of data processing systems, including systems for low cost safety applications.

Techniques for preventing unauthorized access to stored data are known in the art as memory protection. Memory protection may, for example, comprise managing access rights within a memory space. Memory protection may be designed, for example, to allow or deny memory accesses depending on access characteristics such as access initiator, target address, and access type. An access type may, for example, be one of the following types: data read or write operations, instruction fetches during code execution, and vector fetches for exception handling. Memory protection may be implemented, for example, by means of a memory protection unit (MPU). An MPU may be arranged, for instance, to monitor accesses or access attempts and to validate any access or access attempt against a configurable set of rules. An MPU may, however, require expensive hardware. Therefore, MPUs may be not well suited for cost-sensitive applications. Notably, storage for sets of rules and bus monitor logic can make an MPU expensive to build.

SUMMARY OF THE INVENTION

The present invention provides a data storage device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 2 shows an example of a syndrome matrix including unused syndromes.

FIG. 6 shows a table with an overview of various types of memory faults.

DETAILED DESCRIPTION OF THE PREFERRED EMBODIMENTS

Figure 1:
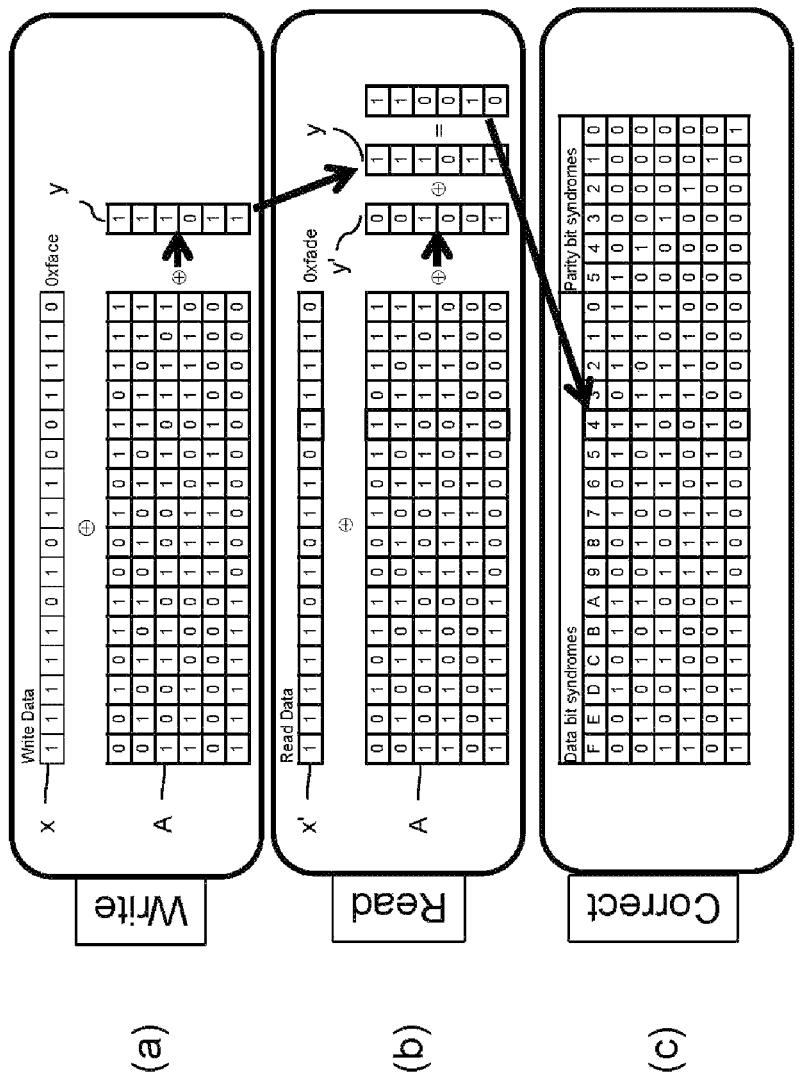
FIG. 1 schematically illustrates an example of an embodiment of an error correction scheme.

FIG. 1 schematically illustrates an example of a single-bit error correction (SEC), double-bit error detection (DED) scheme for a 16-bit data word X. In the example, the data word X has the value 0b1111101011001110 or 0xface. When the data word X is stored, a 16-bit error correcting code Y may be computed and stored along with the data word X. In the example, Y equals 0b111011, as shown in part (a) of the figure. The ECC Y may be computed, for any given data word X, using a syndrome matrix A. Each bit of the data word may have a corresponding column of the syndrome matrix A associated with it. The columns of the syndrome matrix A may also be referred to as syndromes. For example, the syndrome matrix A may comprise M lines and N columns wherein M is the bit length of the ECC Y and N is the bit length of the data word X. The bit length of a string is the number of bits contained in the string. Each syndrome, that is each column of the syndrome matrix A, may be gated with its associated data bit that is with the corresponding bit of the data word X. In other words, column number J of the syndrome matrix A may be gated with bit number J of the data word X. Gating means performing a logical AND operation. Thus, a gated syndrome matrix B (not shown) may be computed, wherein B (I, J)=A (I, J) AND X (J). The parity of each resulting row, that is, the parity of each line of the gated syndrome matrix B, may be taken as one bit of the ECC Y. In other words, Y(I)=SUM (B (I,J), J=1, . . . , N) modulo 2. The error correcting code Y thus generated on the basis of the data word X using the syndrome matrix A may be stored along with the data word X in a memory unit. In one example, the memory unit comprises a set of registers wherein each register is designed to store a data word X together with an associated error correcting code Y. Each data word and the associated error correcting code can thus be stored in a single write operation and can be read in a single read operation.

Referring now to part (b) of FIG. 1, an example of a read access to the memory location at which the data item X has been stored is described. Reading a data item from a memory location may also be referred to as retrieving the data item from the memory location. In the example, it is assumed for the purpose of explanation that the data item X has suffered a single bit flip. More specifically, it is assumed that the corrupted data item X' differs from the original correct data item X in the value of bit number 5. Namely, X (5)=0 whereas X'(5)=1.

The read access may involve computing an ECC for the retrieved data item X' in the same manner as described above with reference to the write operation (part (a) of FIG. 1). Each column of the syndrome matrix A may thus be gated with the corresponding bit of the data item X' read from the memory location. The parity of the gated syndrome matrix B' thus obtained (not shown) may be computed, resulting in a new error correcting code Y'. When the data item X' retrieved from the memory location is identical to the data item X as originally stored, the original error correcting code Y and the new error correcting code Y' are identical (not shown in the Figure). However, when X and X' differ, Y and Y' also differ. Mismatching error correcting codes Y and Y' thus indicate an error. If only a single bit of the data item X has been corrupted (here, the fifth bit), the difference between the stored ECC Y and the recalculated error correcting code Y' is equal to the syndrome of the corrupted bit. In the example, the difference between Y and Y' is Y⊕Y', wherein the symbol ⊕ is the "exclusive or" conjunction. Thus, Y'⊕Y=0b111011⊕0b001001=0b110010, which is precisely the fifth column from the right of the syndrome matrix A. The difference Y⊕Y' between the original and the recalculated error correcting code being equal to the syndrome associated with the fifth data bit indicates that the fifth data bit has flipped and that the other bits of the data item X' are correct, assuming that not more than two bits have been corrupted. The data item X' can thus be corrected by inverting bit 5, that is by flipping Y (5) from 1 to 0.

Double-bit faults may result in a syndrome which is not contained in the syndrome matrix A. In the scheme of FIG. 1, double-bit faults cannot be corrected.

Triple-bit faults may result in a syndrome which falsely indicates a single-bit error. In such a scheme, triple-bit faults can be handled safely only if no error correction is applied.

Quadruple bit faults, or corruption of more than four bits, may result in syndromes which are 0, thus indicating no error. Therefore, they cannot be reliably detected by the present example of an error detection scheme.

This scheme does not only apply to corrupted data bits (X) but also to corrupted ECC bits (Y). A bit flip in the parity bits (Y) may manifest itself in an error syndrome as shown in the extended syndrome matrix in part (c) of FIG. 1 and in FIG. 2.

As illustrated by the table in FIG. 2, the syndrome matrix A (lower left block of the table) of the example does not include every possible syndrome that could in theory be assigned to a bit of a data item. In the example, there are four unused syndromes that is four syndromes which are not contained in the syndrome matrix A, namely, the syndromes 100011, 010011, 001011, and 000111. If the unused syndromes were included in the syndrome matrix A, error detection and error correction would be possible for 20 instead of only 16 data bits.

The device and the method described below are based on the insight that additional information other than information for detection or correction of corrupted data can be incorporated into an error detecting code or into an error correcting code.

Figure 3:
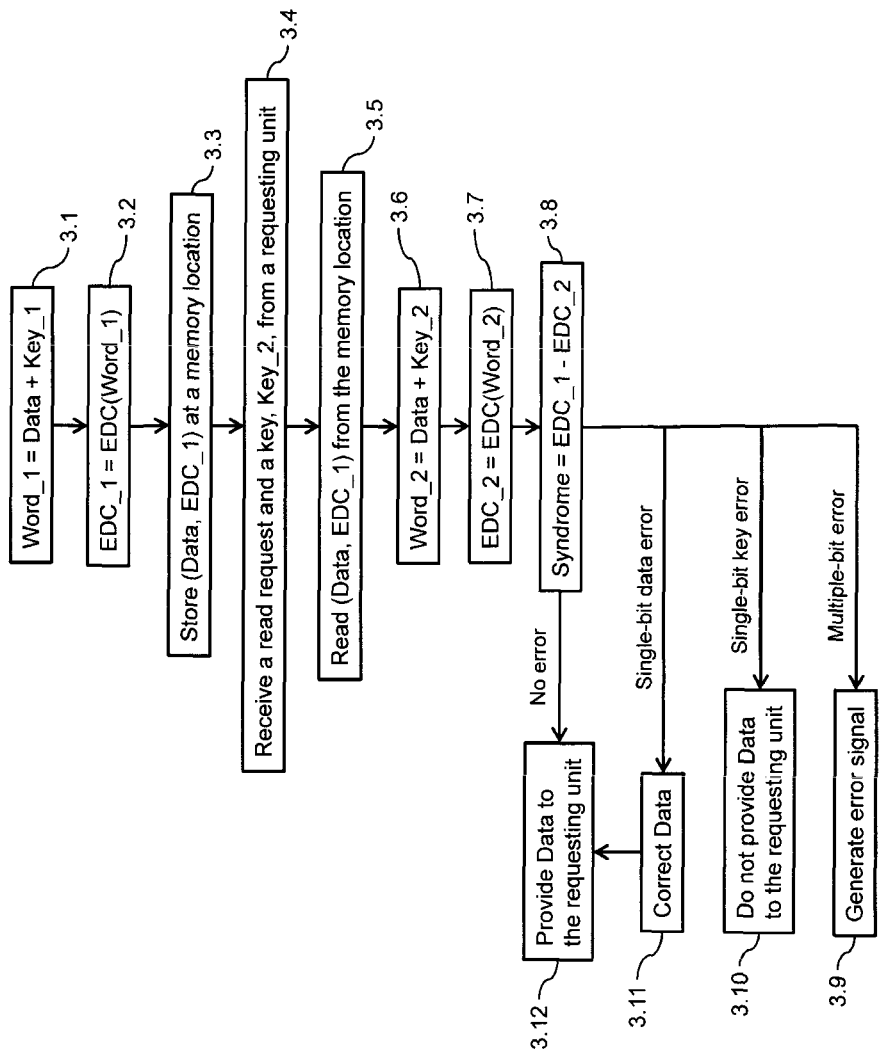
FIG. 3 shows a flow chart of an example of an embodiment of a method of protecting a data item against forbidden access.

Referring to FIG. 3, an example of an embodiment of a method of protecting a data item against unauthorized access is described. The method (blocks 3.1 to 3.12) may comprise: forming a first data word (3.1) which comprises a data item and a first key; computing a first error detection code (3.2) by applying an error detection code generating function to the first data word; and storing the data item along with the first error detection code at a memory location (3.3). The keys may be encoded in a way that guarantees that the number of differing bits of any two keys does not exceed the capability of the error detection scheme. For this SEC-DED example, suitable key encoding schemes may, for example, be "zero one hot" (0b0000, 0b0001, 0b0010, 0b0100, 0b1000), the inverse "zero one cold" (0b1110, 0b1101, 0b1011, 0b0111, 0b1111), or similar schemes. Operations 3.1 to 3.3 may be performed, for example, in response to a write request from a first requesting unit. A requesting unit is a functional unit in a data processing system which attempts to read data from or write data to a memory unit of the data processing system. A requesting unit may be a specific hardware unit, e.g., an embedded device in a system on chip, or an instance of a program running on the data processing device, for example. Also, a requesting unit may be provided by a combination of software and hardware.

The above-mentioned first key, which may be included in the first data word, may, for example, specify protection information associated with the data item. For instance, the first key may specify characteristics or rights which a functional unit must have in order to read the stored data item from the memory location. For example, the first key may specify one or more functional units which are allowed to read the data item from the memory location. Application of the error detection code generating function to the first data word, which comprises the data item and the first key, generates an error detection code (said first error detection code) that contains at least some information provided by the first key. Thus, rather than storing the first key separately along with the data item, the first key may be integrated, at least to some degree, in the first error detection code, thus allowing for a saving in memory space.

The method may further comprise: receiving a read request and a second key associated with the read request (3.4); reading the data item and the first error detection code from the memory location (3.5); forming a second data word (3.6) which comprises the data item read from the memory location and the second key; computing a second error detection code (3.7) by applying the error detection code generating function to the second data word; and determining an syndrome (3.8) on the basis of the first error detection code and the second error detection code. The syndrome may be indicative of whether or not the first data word and the second data word are identical. In other words, a mismatch between the first key and the second key may translate into a syndrome which differs from a syndrome produced when the first key and the second key are identical. In one example, when the first data word and the second data word, e.g., the written data word and the read data word, are identical, the resulting syndrome is 0, as described above in reference to FIG. 1. It is noted, however, that the proposed method can be implemented using any kind of error detection code and that in certain implementations, the second data word matching the first data word may result in a nonzero syndrome. The error detection code generating function may be chosen such that any single-bit errors in the data word, e.g., a bit flip of any one of the bits of the data word, is reflected by the syndrome computed from the first error detection code and the second error detection code. Thus, when the data item read from the memory location is identical to the stored data item but the first key and the second key differ in a single bit (in this SEC example), this can be inferred from the syndrome and an appropriate action may be taken. Such action may comprise, for example, performing the memory access despite the mismatch between the ECC codes.

The method may thus comprise a write access to a memory location (blocks 3.1 to 3.3). The write access may be followed by a read access (blocks 3.4 to 3.12) to the same memory location. The aim of the write access (blocks 3.1 to 3.3) is to store a data item, e.g., a bit string, in the memory unit, e.g., in response to a write request from a functional unit. The aim of the read access (blocks 3.4 to 3.12) is to read the stored data item from the memory unit, e.g., in response to a read request from, e.g., the same or another functional unit. The write access and the subsequent read access may use a first key, and a second key, respectively. In a somewhat simplified picture, the method may be designed such that the data item read from the memory unit in the read access (blocks 3.4 to 3.12) is made available to the read-requesting functional unit only if the first key and the second key are the same. In other words, the data item read from the memory unit should be provided to the requesting unit only if the key associated with the read access, e.g., the second key, is identical to the key associated with the preceding write access, e.g., the first key.

In a simple approach, which is not the object of the present disclosure, the first key may be stored along with the data item in the memory unit. Storing the first key in addition to the data item, may, however, require additional memory, and verifying the key may require additional logic. The alternative approach described in greater detail below does not require storing the first key along with the data item. Instead, use is made of the insight that additional information can be included in an error detection code or in an error correction code, as explained above by way of an example in reference to FIGS. 1 and 2.

In the example of FIG. 3, a first data word is formed on the basis of a data item and a first key. For example, the data item may be merged, e.g., concatenated, with the first key to form the first data word (block 3.1). For example, the first key may be appended to the data item, or the data item may be appended to the first key. However, more complex ways of generating the first data word on the basis of the data item and the first key may be used, at least in principle, provided that the data item and the first key can be recovered unambiguously from the first data word. In other words, the data item and the first key may be encoded in the first data word.

In one example, the data item is a bit string of 16 bits and the first key is a bit string of 4 bits. The first data word may thus have 20 bits, for example. A first error detection code may then be computed by applying an error detection code generating function to the first data word (block 3.2). In an implementation in which the first data word consists of 20 bits, an error detection code generating function as described above with reference to FIGS. 1 and 2 may conveniently be used to generate a first error detection code that consists of 6 bits. It is pointed out, however, that the method may be implemented with data items, keys, and error detection codes or error correction codes which comprise fewer or more bits than mentioned here.

The data item may then be stored along with the first error detection code at a memory location in a memory unit (block 3.3). The memory location may, in principle, comprise several registers or other kinds of memory cells. However, it may be convenient in practice to store the data item along with the first error detection code in a single register, or in a set of registers that are accessible in parallel, so that the data item and the first error detection code can be stored (written) and read (retrieved) at the memory location by a single access, e.g., within a single clock cycle. The memory unit may be any kind of data storage device, e.g., a random access memory (RAM) unit, a flash memory, or a magnetic hard drive. The data item and the associated first key may remain at the memory location for a certain period of time, which may, in principle, be arbitrarily long.

At a certain time, e.g., in response to a read request from a functional unit (block 3.4), the data item and the first error detection code may be read from the memory location (block 3.5). The read request may include or be accompanied by a second key. The second key may, for example, be provided by the functional unit that issued the read request. A second data word may be formed on the basis of the data item retrieved from the memory location and the second key (block 3.6). The second data word may be formed in the same manner as the first data word, using the retrieved data item and the second key instead of the data item to be stored and instead of the first key, respectively. In other words, the first data word (see block 3.1) and the second data word (see block 3.6) may be determined on the basis of the respective data item and the respective key using the same rule. For example, the second key may be appended to the retrieved data item or vice versa. A second error detection code may then be computed on the basis of the second data word (block 3.7). The second error detection code may be computed by applying the error detection code generating function to the second data word. A syndrome may then be determined on the basis of the first error detection code (determined in block 3.2) and the second error detection code (determined in block 3.7). The syndrome may indicate at least whether or not the first data word (determined in block 3.1) and the second data word (determined in block 3.6) are identical. The syndrome may, for example, be computed as a difference between the first error detection code and the second error detection code, e.g., by a bitwise comparison between the first and the second error detection code.

Given a certain data item and a certain first key, as input to block 3.1, various syndromes may be generated, in block 3.8, depending on the data item as read from the memory location, in block 3.5, and depending on the second key, as input in block 3.6.

In a first scenario, the retrieved data item is identical to the stored data item and the second key is equal to the first key. In this case, the first error detection code and the second error detection code are also identical, and the resulting syndrome (block 3.8) will be zero. In contrast, any difference between the first data item and the second data item or between the first key and the second key will result in a syndrome which may be zero or nonzero. A syndrome which is nonzero may therefore be a reliable indication that an error has occurred, namely a mismatch between the original data item and the data item read from the memory location or between the first key and the second key, or between both. In other words, the method may detect at least some, but not necessarily all, types of mismatches between the first data word, which comprises the original data item and the first key, and the second data word, which comprises the retrieved data item and the second key. For example, in a triple-error detection scheme, any triple bit mismatch between the first data word and the second data word produces a syndrome which is nonzero whereas a quadruple bit mismatch may produce a syndrome which is zero.

Still referring to the example of FIG. 3, the error detection code generating function is designed such that single-bit mismatches between the first data word and the second data word can be detected and identified. A single-bit mismatch is a situation in which the first data word and the second data word differ precisely in a single bit. The single-bit mismatch may be either in the data item or in the key included in the respective data word. Identification of a single-bit mismatch means identifying the number of the mismatching bit, e.g., the position of the mismatch in the two data words that are compared.

In the example, various actions may be taken in dependence of the syndrome.

When the syndrome is zero, i.e., when the syndrome does not indicate an error, the data item read from the memory location (in block 3.5) may be provided to the requesting unit, e.g., to the unit that generated the read request (block 3.12). The read access initiated by the requesting unit is thus successful in this case.

When the syndrome indicates a single-bit data error, e.g., a single-bit mismatch between the stored data item (block 3.3) and the retrieved data item (block 3.5), the erroneous bit in the retrieved data item may be reversed to correct the retrieved data item (3.11), that is to restore the data item as it was originally stored (in block 3.3). The corrected data item may then be provided to the requesting unit (block 3.12).

If the syndrome indicates a single-bit key error, that is a single-bit mismatch between the first key and the second key, the requested data item, e.g., the data item read from the memory location (block 3.5) may be not provided to the requesting unit (block 3.10). The read request may thus be refused. The data item stored at the memory location may thus be protected against unauthorized access, e.g., against access by a requesting unit which does not have the access rights for reading the data item from the memory location in question. The required access rights may be encoded in the first key. The actual access rights of the requesting unit may be encoded in the second key. This scheme may be particularly beneficial if the keys are zero-one-hot encoded, i.e., if not more than one bit of any key is set. A single bit error can then only occur if either the first or the second key are zero.

In another implementation, a key which is zero indicates that the data item in question is unprotected. The error syndrome would then be the one of the second key and access may be granted despite of the non-zero syndrome. A zero value for the second key could be used for a privileged access, circumventing the access protection, e.g., debug access. In this case the error syndrome may match the first key.

If the syndrome indicates a multiple bit error, that is the existence of two or more mismatches between the bits of the first data word and the bits of the second data word, an error signal may be generated (block 3.9). Depending on the implementation, the data item read from the memory location (block 3.5) may or may not be provided to the requesting unit. It is noted that in the event of a multiple bit error it may be impossible to identify the particular bits in the second data word which differ from the corresponding bits in the first data word. In particular, it may be impossible to deduce whether the mismatch is in the data item or in the key of the two data words that are compared.

Figure 4:
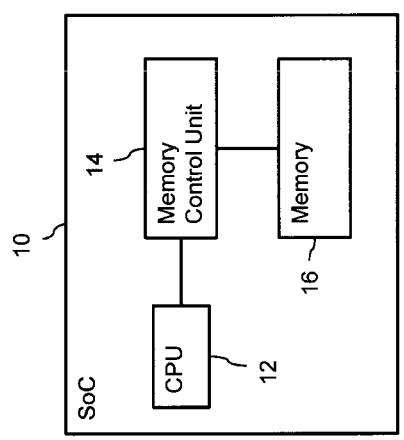
FIG. 4 schematically shows an example of an embodiment of a data processing device.

FIG. 4 schematically shows an example of a data processing device 10. In the example, the data processing device 10 is a system on chip (SOC). The data processing device 10 may, however, be any other kind of digital data processing device, e.g., a system distributed across two or more physical devices that are suitably interconnected or in communication with each other to exchange data. The data processing device 10 may comprise a data storage device, or the entire data processing device 10 may be considered a data storage device. In the example, the data processing device 10 comprises a processing unit 12, e.g., a central processing unit (CPU) which may comprise one or more processor cores. The data processing device 10 further comprises a memory unit 16 and a memory control unit 14. The memory control unit 14 may be connected to the memory unit 16 or be integrated in it. Alternatively, the memory control unit 14 may, for example, be integrated in the processing unit 12. The memory control unit 14 and the memory unit 16 together form a data storage device 14, 16. The data storage device 14, 16 may be arranged to store a data item and to protect the stored data item against prohibited access. To this end, the memory control unit 14 may be arranged, e.g. upon receiving a write request thereat, to: form a first data word which comprises the data item and a first key; compute a first error-detection code by applying an error-detection code generating function to the first data word; and store the data item along with the first error-detection code at a memory location in the memory unit. The memory control unit 14 may further be arranged, e.g. upon receiving a read request thereat, to read the data item and the first error-detection code from the memory location; form a second data word which comprises the data item read from the memory location and a second key; compute a second error-detection code by applying the error-detection code generating function to the second data word; and determine a syndrome on the basis of the first error-detection code and the second error-detection code, wherein the syndrome is indicative of whether or not the first data word and the second data word are identical.

The store operation and the read operation performed by the memory control unit may be performed, for example, in response to a store request (write request) and a read request from a first requesting unit and a second requesting unit, respectively. The first and the second requesting units may be the same or different functional units, e.g., the same or different instances of a program executed by the processing unit 12. The memory control unit 14 may be further arranged to grant or to refuse the access request, or to generate an error signal, in dependence of the syndrome determined on the basis of the first and second error detection codes. The key for protecting the data word may thus be encoded in the error detection code associated with the data word, thus allowing for a reduction in physical memory when compared to a device in which dedicated memory space is provided for storing a key, e.g., a key comprising access write information, along with the data word.

In one example, the key associated with a data item stored in the memory unit may be freely chosen. That is, when the key is a bit string of length K, the key may be selected among the complete set of 2K (two to the power K) different bit strings of length K. Such an implementation may have the advantage of offering a large number of different possible key values. For example, in an implementation in which K=4, there are 24=16 different possible key values. On the other hand, a drawback may be that the key associated with the read access, e.g., the above mentioned second key, may differ from the key associated with the preceding write access, e.g., the first key, in up to K bits. For instance, again considering the example of K=4, the first key might be 1010 and the second key might be 0101. This discrepancy is a 4-bit error, and a relatively powerful and therefore expensive error detecting code may be required in order to detect a 4-bit error reliably.

In another example, the set of possible key values, e.g., the set of bit strings that can be used as a key for a data item to be stored, and as a key for reading a data item, may be restricted such that any pair of keys has at most L mismatching bits, wherein L is less than K. In other words, it may be ensured that the first key, e.g., the key of the write access, and the second key, e.g., the key of the read access, may have not more than L mismatching bits, wherein L is less than the total number of bits in each key. For example, the set of possible key values may be restricted to bit strings in which not more than P bits are 1 and the remaining bits are all 0. In this case L=2*P and P may be such that 2*P is less than K to ensure that L is less than K. In a particularly simple and inexpensive implementation, P=1 and, accordingly, L=2. An error correcting code capable of reliably detecting double-bit errors may then be sufficient to detect any invalid access by comparing the first key and the second key.

An example in which P=1 is described with reference to FIGS. 5 and 6. In this example, each bit of a given key may correspond to a particular region of the memory unit. A region of the memory unit is a set of memory locations in the memory unit. A region is not necessarily coherent but may comprise incoherent subregions. The error detection code stored at a memory location may assign the respective memory location to not more than one of K different regions, K being the bit length of the key. A memory location may belong to no region, if, for example, the key encoded in the error detection code of the memory location is zero, that is, if every bit of the key has the value 0. For instance, when K=4, only five keys may be allowed, namely, the keys 0000, 0001, 0010, 0100, and 1000. These five keys may be regarded as indicating that the memory location in question belongs to no region, to a region A, to a region B, to a region C, and to a region D, respectively.

Figure 5:
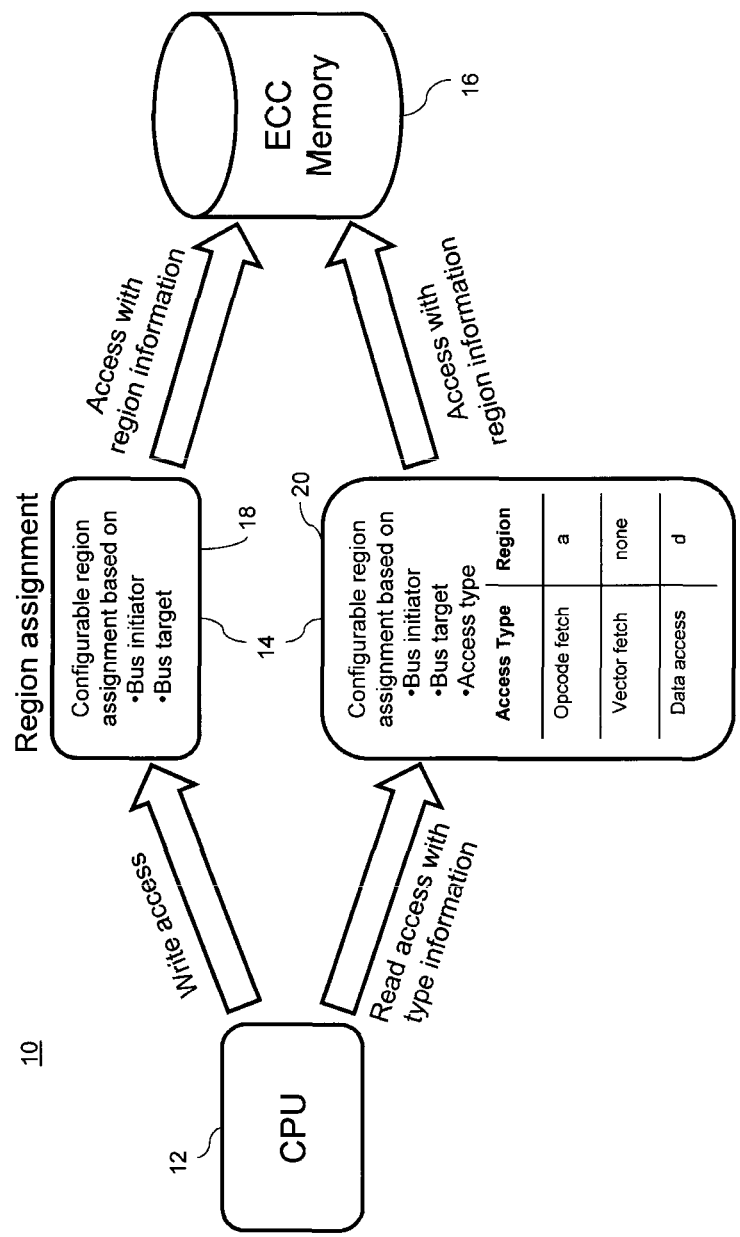
FIG. 5 schematically illustrates an example of an embodiment of a memory protection scheme.

FIG. 5 schematically illustrates an example of a data processing device 10 comprising a memory unit 14 in which four regions A to D may be defined. The memory control unit 14 may comprise a write control unit 18 and a read control unit 20. The write control unit 18 may be arranged to assign none or one of the regions A to D to a data item which is to be stored in the memory unit 16. The region may be assigned on the basis of, for example, write access characteristics, e.g., an address or identifier of a bus initiator or bus target. A rule according to which a region is assigned may be configurable. In other words, the data item to be stored may be assigned one of the five keys 0000, 0001, 0010, 0100, and 1000. The key may, for example, be appended to the data item to form a data word as described above. An error detection code, e.g., an error correcting code, for example, a single-bit error correcting and double-bit error detecting code, may be computed on the basis of the data word. The data item may be stored along with the thus computed error detecting code in the memory unit 16.

The read control unit 20 may be arranged to operate as follows, for example. In response to a read request, the read control unit 20 may select none or one of the four regions A to D in dependence of, for example, characteristics of the read request or on the basis of information conveyed with the read request. Such characteristics or information may, for example, include information specifying a bus initiator, a bus target, and an access type. For instance, a request for fetching an operational code (Opcode fetch), a request for fetching a vector (vector fetch), and a request for reading data (data access) may be examples of different access types. Accordingly, a particular region may be selected in dependence of whether the read request is an Opcode fetch, a vector fetch, or a data access, for example. In the shown example, region A is selected for an Opcode fetch, no region is selected for a Vector fetch, and region D is selected for a data access, resulting in the keys 0001, 0000, and 1000, respectively. The data item may be read from the memory location specified by the read request, and a second data word may be formed on the basis of the retrieved data item and the selected key (second key), for example, by appending the second key to the retrieved data item. A second error detection code may then be determined on the basis of the second data word. The first data word, e.g., the data word of the write access, and the second data word, e.g., the data word of the read access, may then be compared to determine a syndrome. An appropriate action, which may include providing or not providing the retrieved data item to the requesting unit, e.g., to the processing unit 12, may then be taken in dependence of the syndrome. A violation of access rules may thus manifest itself in mismatching regions, which may be detected as ECC single or double-bit faults.

Privileged accesses, overwriting access protection, may also be implemented. In this case, read accesses may be attempted without expecting any region. The second key may be zero for this purpose. A privileged read access to a protected memory location may then result in a single-bit error, revealing the region of the targeted memory location.

The error detection mechanism described above may detect access violations as well as memory corruption. Simultaneous occurrence of both an access violation and a memory corruption may, however, exceed the capability of the ECC mechanism. The table in FIG. 6 shows scenarios of simultaneous fault conditions in an example of an ECC scheme capable of single-bit error correction and double-bit error detection. For instance, specifying region B in a write access to a memory location and region A in a subsequent read access to the same memory location may produce a double-bit error when the data item is not corrupted, i.e., when the data item read from the memory location is identical to the data item as originally stored. If, however, the retrieved data item differs from the original data item in a single bit (single-bit data corruption) there will be a total of three mismatching bits in the data word, still considering the case in which the regions of the write access and the read access are B and A, respectively. Depending on the type of error detection code that is used, a triple-bit mismatch can be detected reliably only if the error detection code is implemented without error correction. A triple-bit error detection code without error correction may be particularly convenient for a low cost implementation. However, if memory corruption and access violation do not occur frequently, simultaneous occurrence may be unlikely and an implementation with double-bit error detection and single-bit error correction may also be acceptable. The advantage of single-bit data correction may then outweigh the drawback of not reliably detecting any triple-bit faults in the data word.

Thus, now referring collectively to FIGS. 3 to 6, a data processing device 10 comprising a memory unit 16 and a memory control unit 14 are proposed. The memory control unit may be arranged to protect data items stored in the memory unit against prohibited access. The memory control unit 16 may be arranged to perform, in this order, a write access and a read access to a memory location in the memory control unit 14. The write access may comprises: forming a first data word which comprises a data item and a first key; computing a first error-detection code by applying an error-detection code generating function to the first data word; and storing the data item along with the first error-detection code at the memory location in the memory unit. The read access may comprise: reading the data item and the first error-detection code from the memory location; forming a second data word which comprises the data item read from the memory location and a second key; computing a second error-detection code by applying the error-detection code generating function to the second data word; and determining a syndrome on the basis of the first error-detection code and the second error-detection code, wherein the syndrome is indicative of whether or not the first data word and the second data word are identical. Each of the first key and the second key may comprise access permission information.

In one implementation, each of the first key and the second key is a string of K bits, wherein the first key and the second key differ from each other in at most L bits, wherein L is at least two and less than K. In other words, the first key and the second key may be selected among a first set of allowed keys and a second set of allowed keys, respectively, wherein the first set and the second set are such that any key of the first set and any key of the second set have not more than L mismatching bits. For example, L=2. In the same or in another implementation, K is greater or equal two and each of the first key and the second key is a string of K bits that includes at most a single bit of value one, the remaining K or K−1 bits of the string having the value zero. For example, K may be one of the integers three to twelve. E.g., K=4. Conveniently, the error-detection code generating function is suitable for single-bit error correction and double-bit error detection. Alternatively or in addition, the error-detection code generating function is suitable for triple-bit error detection.

The write access may be initiated by a write-requesting unit and the read access may be initiated by a read-requesting unit. The write-requesting unit may, for example, be an instance of a program and the read-requesting unit may be another instance of the program or an instance of another program. The memory control unit 14 may be arranged to provide the data item to the read-requesting unit in response to the syndrome indicating that the first data word and the second data word are identical. Also, the memory control unit 14 may be arranged to correct the data item 3.11 in response to the syndrome indicating one or more corrupted bits in the data item. Furthermore, the memory control unit 14 may be arranged not to provide the data item to the read-requesting unit 3.10 in response to the syndrome indicating a mismatch between the first key and the second key. Alternatively, the memory control unit 14 may be arranged to provide the data item to the read-requesting unit in response to the syndrome indicating a single-bit mismatch between the first key and the second key, and arranged not to provide the data item to the read-requesting unit in response to the syndrome indicating a double-bit mismatch between the first key and the second key. The data processing device may be arranged to generate the first key and the second key on the basis of characteristics of the read access and characteristics of the write access, respectively. The characteristics of the write access may comprise, for example, one or more of an identifier of the write-requesting unit and a type of the first data item. The characteristics of the read access may comprise, for example, one or more of an identifier of the read-requesting unit and a type of the second data item. Possible types of the first data item and the second data item may include, for example, operational code, vector code, and data.

The method of storing and protecting a data item in a memory unit 16 comprises a write access to a memory location in the memory unit (16) and a subsequent read access to the memory location. The write access may comprise: forming a first data word which comprises a data item and a first key (3.1); computing a first error-detection code by applying an error-detection code generating function to the first data word (3.2); and storing the data item along with the first error-detection code at the memory location (3.3). The read access may comprise: reading the data item and the first error-detection code from the memory location (3.5); forming a second data word which comprises the data item read from the memory location and a second key (3.6); computing a second error-detection code by applying the error-detection code generating function to the second data word (3.7); and determining a syndrome on the basis of the first error-detection code and the second error-detection code (3.8), wherein the syndrome is indicative of whether or not the first data word and the second data word are identical. The data item may be provided to the read-requesting unit (3.12) in response to the syndrome indicating that the first data word and the second data word are identical.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the memory control unit 14 may be merged with the processing unit 12 or with the memory unit 16.

Also for example, in one embodiment, the illustrated examples may be implemented as circuitry located on a single integrated circuit or within a same device. For example, the processing unit 12, the memory control unit 14, and the memory unit 16 may be located on a single integrated circuit, e.g., in a system-on-chip. Alternatively, the examples may be implemented as any number of separate integrated circuits or separate devices interconnected with each other in a suitable manner. For example, the units 12, 14, and 16 may implemented as separate devices that can be interconnected with each other via suitable interfaces.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A data processing device comprising a memory unit and a memory control unit, the memory control unit being arranged to protect data items stored in the memory unit against prohibited access, wherein the memory control unit is arranged to perform a write access and a read access to a memory location in the memory control unit, wherein upon the write access the memory control unit is arranged to:
   form a first data word which comprises a data item and a first key;
   compute a first error-detection code by applying an error-detection code generating function to the first data word; and
   store the data item along with the first error-detection code at the memory location in the memory unit;
   and wherein upon the read access the memory control unit is arranged to:
   read the data item and the first error-detection code from the memory location;
   form a second data word which comprises the data item read from the memory location and a second key;
   compute a second error-detection code by applying the error-detection code generating function to the second data word; and
   determine a syndrome on the basis of the first error-detection code and the second error-detection code, wherein the syndrome is indicative of whether or not the first data word and the second data word are identical.

2. The data processing device of claim 1, wherein each of the first key and the second key comprises access permission information.

3. The data processing device of claim 1, wherein each of the first key and the second key is a string of K bits, K is at least three and wherein the first key and the second key differ from each other in at most L bits, wherein L is at least two and less than K.

4. The data processing device of claim 3, wherein L=2.

5. The data processing device of claim 4, wherein the error-detection code generating function is suitable for triple-bit error detection.

6. The data processing device of claim 4, wherein the error-detection code generating function is suitable for single-bit error correction and double-bit error detection.

7. The data processing device of claim 3, wherein K is greater or equal two and wherein each of the first key and the second key is a string of K bits that includes at most a single bit of value one, the remaining K or K−1 bits of the string having the value zero.

8. The data processing device of claim 7, wherein the error-detection code generating function is suitable for single-bit error correction and double-bit error detection.

9. The data processing device of claim 3, wherein the error-detection code generating function is suitable for single-bit error correction and double-bit error detection.

10. The data processing device of claim 1, wherein the write access is initiated by a write-requesting unit and the read access is initiated by a read-requesting unit.

11. The data processing device of claim 10, wherein the write-requesting unit is an instance of a program and wherein the read-requesting unit is another instance of the program or an instance of another program.

12. The data processing device of claim 11, wherein the memory control unit is arranged not to provide the data item to the read-requesting unit in response to the syndrome indicating a mismatch between the first key and the second key.

13. The data processing device of claim 10, wherein the memory control unit is arranged to provide the data item to the read-requesting unit in response to the syndrome indicating that the first data word and the second data word are identical.

14. The data processing device of claim 13, wherein the memory control unit is arranged not to provide the data item to the read-requesting unit in response to the syndrome indicating a mismatch between the first key and the second key.

15. The data processing device of claim 10, wherein the memory control unit is arranged to correct the data item in response to the syndrome indicating one or more corrupted bits in the data item.

16. The data processing device of claim 10, wherein the memory control unit is arranged not to provide the data item to the read-requesting unit in response to the syndrome indicating a mismatch between the first key and the second key.

17. The data processing device of claim 10, wherein the memory control unit is arranged to provide the data item to the read-requesting unit in response to the syndrome indicating a single-bit mismatch between the first key and the second key, and arranged not to provide the data item to the read-requesting unit in response to the syndrome indicating a double-bit mismatch between the first key and the second key.

18. The data processing device of claim 10, arranged to generate the first key and the second key on the basis of characteristics of the read access and characteristics of the write access, respectively,
wherein the characteristics of the write access comprise one or more of: an identifier of the write-requesting unit and a type of the first data item; and
wherein the characteristics of the read access comprise one or more of: an identifier of the read-requesting unit and a type of the second data item.

19. The data processing device of claim 10, wherein the memory control unit is arranged not to provide the data item to the read-requesting unit in response to the syndrome indicating a mismatch between the first key and the second key.

20. A method of storing and protecting a data item in a memory unit, wherein the method comprises a write access to a memory location in the memory unit and a subsequent read access to the memory location, wherein the write access comprises:
forming a first data word which comprises a data item and a first key;
computing a first error-detection code by applying an error-detection code generating function to the first data word;
storing the data item along with the first error-detection code at the memory location;
and wherein the read access comprises:
reading the data item and the first error-detection code from the memory location;
forming a second data word which comprises the data item read from the memory location and a second key;
computing a second error-detection code by applying the error-detection code generating function to the second data word; and
determining a syndrome on the basis of the first error-detection code and the second error-detection code, wherein the syndrome is indicative of whether or not the first data word and the second data word are identical.

* * * * *